May 7, 1968 V. J. CAPANO 3,381,372

METHOD OF ELECTRICALLY CONNECTING AND HERMETICALLY SEALING PACKAGES FOR MICROELECTRONIC CIRCUITS

Filed July 13, 1966 2 Sheets-Sheet 1

INVENTOR.
VINCENT J. CAPANO
BY Robert J. Haase
ATTORNEY

May 7, 1968 V. J. CAPANO 3,381,372

METHOD OF ELECTRICALLY CONNECTING AND HERMETICALLY SEALING PACKAGES FOR MICROELECTRONIC CIRCUITS

Filed July 13, 1966 2 Sheets-Sheet 2

INVENTOR.
VINCENT J. CAPANO
BY
Robert J. Haase
ATTORNEY

United States Patent Office 3,381,372
Patented May 7, 1968

3,381,372
METHOD OF ELECTRICALLY CONNECTING AND HERMETICALLY SEALING PACKAGES FOR MICROELECTRONIC CIRCUITS

Vincent J. Capano, Danbury, Conn., assignor to Sperry Rand Corporation, a corporation of Delaware
Filed July 13, 1966, Ser. No. 564,963
2 Claims. (Cl. 29—627)

ABSTRACT OF THE DISCLOSURE

A method of establishing electrical connections between external leads and surface conductors of a microelectronic circuit. The method comprises placing a band or preform of conductive material between the surface conductors at the periphery of the microelectronic circuit and the overlying terminations of the external conductors and then heating the entire assembly so as to cause the material of the preform to flow and localize only at the locations where the surface conductors and the terminations of the external leads mate with one another.

The present invention generally relates to microelectronic circuits and, more particularly, to packaging means for establishing electrical connections to a microelectronic circuit and for hermetically sealing the same.

Prior art microelectronic circuit packaging techniques generally involve the use of thermo-compression wire bonding for establishing electrical connections from external leads to the microelectronic circuit prior to the hermetic sealing of said circuit. In addition to the inherent laborious and costly nature of the thermo-compressing bonding process, there are the problems of reduced reliability and yield. Reliability and yield are adversely affected by the thermal stresses resulting from the non-uniform and localized application of heat to the microelectronic circuit during the process of thermo-compression bonding.

One object of the present invention is to provide a method for establishing electrical connection to desired points of a microelectronic circuit without requiring the use of thermo-compression bonding.

Another object is to provide packaging means for establishing electrical connections to desired areas of a microelectronic circuit and for hermetically sealing the same.

A further object is to provide means for simultaneously establishing electrical connections between external leads and all desired points of a microelectronic circuit.

These and other objects of the present invention, as will appear from a reading of the following specification, are achieved in a preferred embodiment by the provision of a method and by the provision of packaging means for establishing electrical connections simultaneously to all desired points of a microelectronic circuit and for hermetically sealing the same. In accordance with the present invention, there is provided a microelectronic circuit whose internal circuit points (to which electrical access is desired) are connected to surface conductors which terminate in a predetermined pattern about the periphery of the microelectronic circuit. The microelectronic circuit is formed on a rectangular substrate in the disclosed embodiment. The substrate, in turn, is fixed to a rectangular base plate on the side of the wafer opposite the side on which the aforementioned surface conductors are located. The base plate is of larger rectangular area than the substrate. The portions of the base plate which extend beyond the substrate provide a rectangular flange which is metalized for hermetically sealing to the metalized edges of a mating hat or cover member.

The cover member contains recessed interior ledges which mate with the periphery of the substrate where the aforementioned surface conductors terminate. The cover member further is equipped with external leads that penetrate the sides of the cover member and terminate along the interior ledges. The disclosed embodiment further comprises two rectangular bands or preforms of a material suitable for brazing or soldering. One of the preforms is dimensioned so that it will fit between the periphery of the substrate (where the microelectronic circuit surface conductors terminate) and the interior ledegs of the cover member (where the external leads terminate) when the cover member and substrate are assembled. The other preform is dimensioned to fit between the metalized flange of the base plate and the metalized edge of the cover member when the cover member and substrate are assembled.

The unit is assembled with the preforms positioned as described and is then subjected to sufficient heat to cause the preform material to flow. The flowing preform material selectively wets the metalized surface conductors about the periphery of the substrate and the external leads whose metalized terminations lie on the ledge of the cover member. There is substantially no wetting of the substrate or of the cover member other than at metalized locations. The surface tension of the flowing preform material causes said material to localize exclusively at the points where electrical connection is desired between the surface conductors of the microelectronic circuit and the external leads. Thus, all of the desired electrical connections are made simultaneously by the application of uniform heat to the entire assembled unit whereby thermal stresses tending to reduce reliability and yield are eliminated. During the same heating operation in which the electrical connections are established, the base plate is brazed to the edge of the cover member to hermetically seal the entire package.

For a more complete understanding of the present invention, reference should be had to the following specification and to the figures of which:

Figure 1:
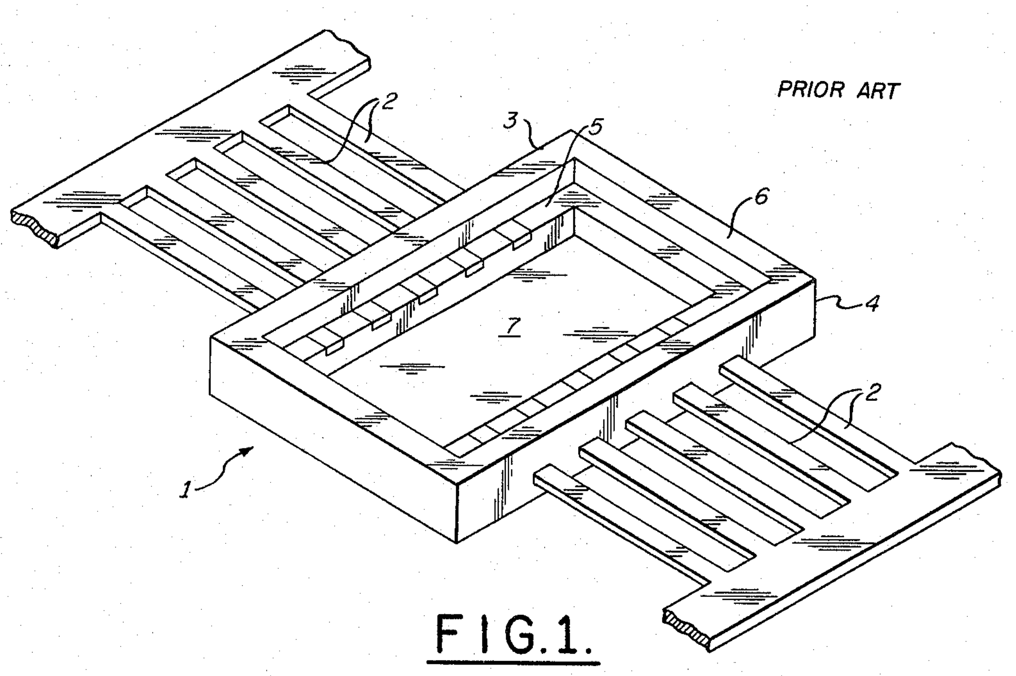
FIGURE 1 is a perspective view of the cover member component utilized in the present invention.

The cover member 1 represented by FIGURE 1 is a standard commercially available item which is equipped with a plurality of external circuit connectors or leads 2. The leads 2 penetrate the walls 3 and 4 of cover member 1 and terminate on a respective recessed interior ledge such as ledge 5. Cover member 1 typically is made of a ceramic electrically insulating material whereby the electrical leads 2 are isolated from each other. The rectangular edge 6 of cover member 1 is metalized so that it can be brazed to a mating surface of the microelectronic circuit base plate (not shown). Cover member 1 is closed on side 7.

Figure 2:
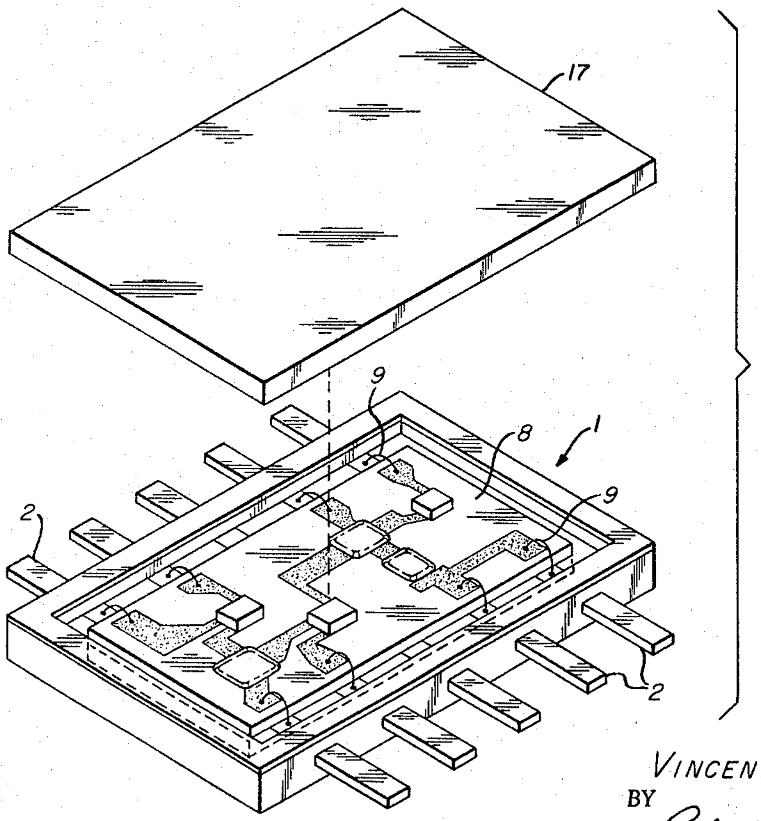
FIG.2. PRIOR ART
FIGURE 2 is a view of prior art thermo-compression bonding means for establishing electrical connections between the microelectronic circuit and the external leads of the cover member of FIGURE 1.

Referring to FIGURE 2, base plate 17 is shown removed to expose to view a typical microelectronic circuit 8 inserted in and connected to the cover member 1 of FIGURE 1 in accordance with the existing state of the art technique. Said technique involves the use of short wires 9 between the respective terminals of leads 2 and the corresponding points of the microelectronic circuit. The leads 9 typically are thermo-compression bonded individually to the microelectronic circuit points and to the terminals of leads 2. It should be noted that non-uniform and localized heat is applied to the microelectronic circuit during the establishment of the individual thermo-compression bonds thus subjecting the established microelectronic circuit to possibly damaging thermal stresses. The present invention is directed at the establishment of electrical connections between the external leads and the desired points of the microelectronic circuit without requiring any wires such as wires 9 of FIGURE 2 and without requiring any thermo-compression bonding.

Figure 3:
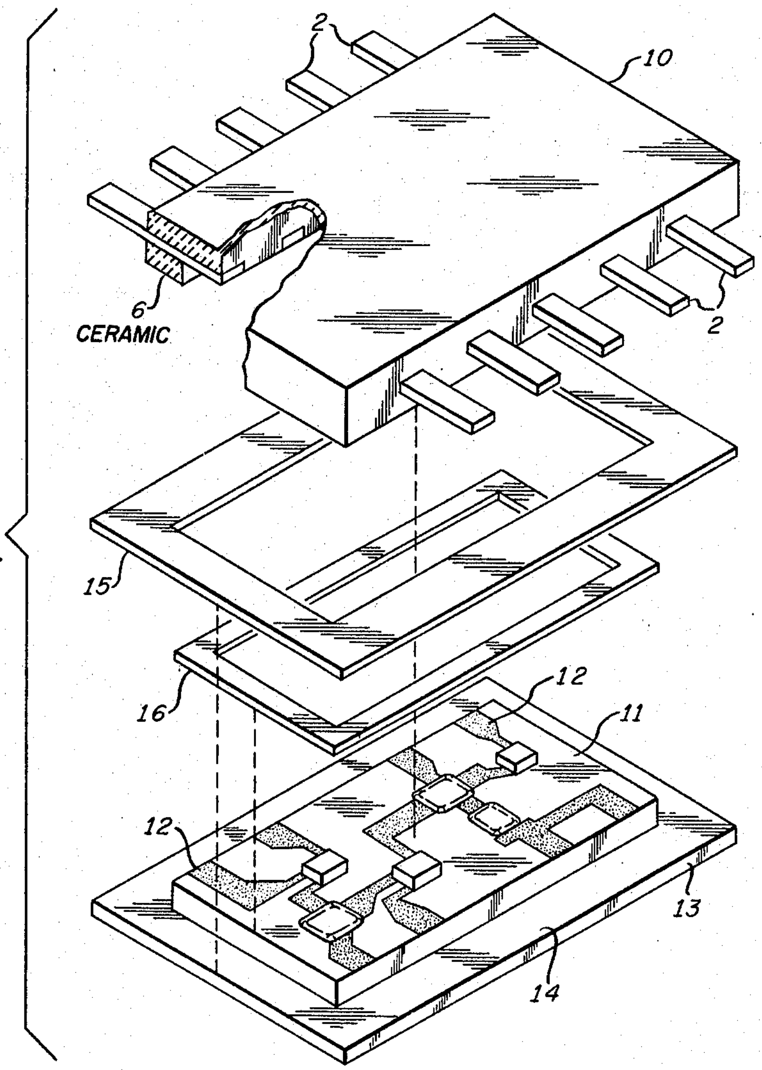
FIGURE 3 is an exploded perspective view of the constituent members of the packaging means of the present invention prior to assembly.

FIGURE 3 is an exploded view of the parts comprising the package of the present invention. Said package includes a cover member 10 similar to the cover member of FIGURES 1 and 2. The package additionally includes microelectronic circuit 11 which is provided with surface conductors 12 extending between the periphery of microelectronic circuit 11 and the circuit points thereof at which external electrical connections are to be established. Microelectronic circuit 11 is mounted on base plate 13 having a flange portion 14 which is metalized in the same manner as rectangular edge 6 of cover member 1 of FIGURE 1. There are also provided rectangular bands or preforms 15 and 16 made of a suitable material for effecting soldering or brazing of metalized portions 14 and 6 of FIGURES 3 and 1, respectively. A gold-tin eutectic composition is a suitable material for preforms 15 and 16 in the event that elements 12, 14 and 6 are metalized with gold. As shown in the exploded view of FIGURE 3, preform 16 is dimensioned to fit between the periphery of microelectronic circuit 11 and the terminations of leads 2 inside cover member 10. Preform 15 is dimensioned to fit between metalized portion 14 of base plate 13 and metalized edge 6 of cover member 10.

Figure 4:
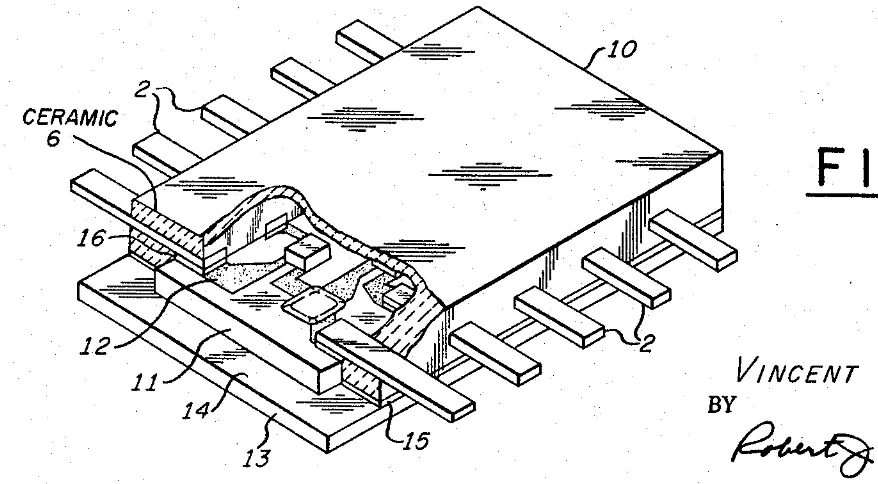
FIGURE 4 is a partly cut away perspective view of the assembled packaging means of FIGURE 3.

FIGURE 4 represents the assembled package of the component parts represented in the exploded view of FIGURE 3. The entire assembled package is subjected to heat sufficient to cause the flow of the material comprising preforms 15 and 16. The preform material selectively wets exclusively the metalized portions of the members with which it is in contact. The preform material does not wet either the non-metalized portions of the microelectronic circuit 11 or the non-metalized portion (ceramic) of the cover member 1. The combined effects of the surface tension of the flowing preform material and the selected wetting action redistributes the flowing preform material at the localized positions of the terminals of external leads 2 and the terminals of surface conductors 12 thus establishing sound electrical connections between the two. The preform material does not bridge the spaces between the adjacent leads and the adjacent surface conductors. At the same time that the material of preform 16 establishes the desired electrical connections, the material of preform 15 brazes base plate 13 to cover member 10 and hermetically seals the entire unit.

While the invention has been described in its preferred embodiments, it is to be understood that the words which have been used are words of description rather than of limitation and that changes within the purview of the appended claims may be made without departing from the true scope and spirit of the invention in its broader aspects.

What is claimed is:

1. The method for simultaneously establishing electrical connections between metalized external leads and all desired points of a microelectronic circuit comprising providing a microelectronic circuit having points to be electrically connected to external leads, said points being connected to metalized conductors on the surface of said circuit, said conductors terminating at the periphery of said circuit, providing a member of electrical insulating material having said leads, the terminations of said leads being spaced in mating relationship with said conductors at the periphery of said circuit, providing a preform of conductive material dimensioned to conform to the periphery of said circuit and to said terminations of said metalized leads for joining said metalized conductors and said metalized leads upon the application of heat, said material wetting exclusively said metalized conductors and said metalized leads, placing said preform between said metalized conductors at the periphery of said circuit and said terminations of said metalized leads, and heating said microelectronic circuit, said member of electrical insulating material and said preform so as to cause the material of said preform to flow and localize at the locations of said metalized conductors and said terminations of said metalized leads.

2. The method for simultaneously establishing electrical connections as defined in claim 1 wherein said microelectronic circuit is equipped with a metalized flange extending from the periphery thereof and said member of electrical insulating material is equipped with a metalized edge in mating relationship with said metalized flange and is dimensioned and shaped so as to receive and enclose said microelectronic circuit, said method further comprising providing a second preform of material for joining said metalized flange and said metalized edge, placing said second preform between said metalized flange and said metalized edge, and heating said second preform so as to cause the material of said second preform to join said metalized flange and said metalized edge.

References Cited

UNITED STATES PATENTS

| | | |
|---|---|---|
| 3,239,719 | 3/1966 | Shower. |
| 3,292,241 | 12/1966 | Carroll. |

FOREIGN PATENTS

| | | |
|---|---|---|
| 1,015,909 | 1/1966 | Great Britain. |

DARRELL L. CLAY, *Primary Examiner.*